US008462467B2

(12) United States Patent
Yanagisawa et al.

(10) Patent No.: US 8,462,467 B2
(45) Date of Patent: Jun. 11, 2013

(54) THIN FILM MAGNETIC HEAD INCLUDING SOFT LAYER MAGNETICALLY CONNECTED WITH SHIELD

(75) Inventors: Takumi Yanagisawa, Tokyo (JP); Yasushi Nishioka, Tokyo (JP); Takahiko Machita, Tokyo (JP); Satoshi Miura, Tokyo (JP); Takayasu Kanaya, Tokyo (JP); Kenzo Makino, Tokyo (JP); Yoshikazu Sawada, Tokyo (JP); Takekazu Yamane, Tokyo (JP); Naomichi Degawa, Tokyo (JP); Kosuke Tanaka, Tokyo (JP); Soji Koide, Tokyo (JP); Daisuke Miyauchi, Tokyo (JP)

(73) Assignee: TDK Corporation, Tokyo (JP)

( * ) Notice: Subject to any disclaimer, the term of this patent is extended or adjusted under 35 U.S.C. 154(b) by 257 days.

(21) Appl. No.: 12/900,879

(22) Filed: Oct. 8, 2010

(65) Prior Publication Data
US 2012/0087046 A1 Apr. 12, 2012

(51) Int. Cl.
*G11B 5/39* (2006.01)
(52) U.S. Cl.
USPC ..................................... 360/319; 360/324.12
(58) Field of Classification Search
USPC ..................................... 360/319, 324–324.2
See application file for complete search history.

(56) References Cited

U.S. PATENT DOCUMENTS

| 5,838,521 | A * | 11/1998 | Ravipati .................. 360/319 |
| 6,769,170 | B1 * | 8/2004 | Shimazawa et al. ....... 29/603.09 |
| 7,295,401 | B2 * | 11/2007 | Jayasekara et al. ...... 360/125.08 |
| 7,599,151 | B2 * | 10/2009 | Hatatani et al. ............... 360/319 |
| 8,014,108 | B2 * | 9/2011 | Shimazawa et al. .......... 360/319 |
| 8,089,734 | B2 * | 1/2012 | Miyauchi et al. ............. 360/319 |
| 8,203,809 | B2 * | 6/2012 | Zhou et al. ............... 360/324.12 |
| 2004/0156148 | A1 | 8/2004 | Chang et al. |
| 2005/0157431 | A1 * | 7/2005 | Hatatani et al. ............... 360/319 |
| 2005/0264948 | A1 | 12/2005 | Nakamoto et al. |
| 2006/0098334 | A1 * | 5/2006 | Jayasekara et al. ........... 360/125 |
| 2011/0051291 | A1 * | 3/2011 | Miyauchi et al. .......... 360/245.3 |
| 2011/0279923 | A1 * | 11/2011 | Miyauchi et al. ............... 360/75 |
| 2012/0147504 | A1 * | 6/2012 | Zhou et al. ............... 360/324.12 |

FOREIGN PATENT DOCUMENTS

| JP | 06084144 A | * | 3/1994 |
| JP | 2004127420 A | * | 4/2004 |
| JP | A-2004-178656 | | 6/2004 |
| JP | 2004259330 A | * | 9/2004 |

(Continued)

OTHER PUBLICATIONS

English-machine translation of JP 2006-179566 A to Kagami, published on Jul. 6, 2006.*

(Continued)

*Primary Examiner* — Will J Klimowicz
(74) *Attorney, Agent, or Firm* — Posz Law Group, PLC

(57) ABSTRACT

A thin film magnetic head includes: a magneto resistance effect film of which electrical resistance varies corresponding to an external magnetic field; a pair of shields provided on both sides in a manner of sandwiching the MR film in a direction that is orthogonal to a film surface of the MR film; an anisotropy providing layer that provides exchange anisotropy to a first shield of the pair of shields in order to magnetize the first shield in a desired direction, and that is disposed on the opposite side from the MR film with respect to the first shield; and side shields that are disposed on both sides of the MR film in a track width direction and that include soft magnetic layers magnetically connected with the first shield.

16 Claims, 8 Drawing Sheets

FOREIGN PATENT DOCUMENTS

| | | | |
|---|---|---|---|
| JP | A-2005-203063 | | 7/2005 |
| JP | A-2005-353666 | | 12/2005 |
| JP | 2006179566 A | * | 7/2006 |
| JP | 2007173506 A | * | 7/2007 |
| JP | 2009134850 A | * | 6/2009 |
| JP | 2010102817 A | * | 5/2010 |

OTHER PUBLICATIONS

English-machine translation of JP 2009-134850 A to Shimazawa et al., published on Jun. 18, 2009.*

U.S. Appl. No. 12/900,845, filed Oct. 8, 2010, Yanagisawa et al.

* cited by examiner

THIN FILM MAGNETIC HEAD INCLUDING SOFT LAYER MAGNETICALLY CONNECTED WITH SHIELD

CROSS REFERENCE TO RELATED APPLICATION

This application is related to U.S. patent application Ser. No. 12/900,845, entitled "THIN FILM MAGNETIC HEAD INCLUDING SPIN-VALVE FILM WITH FREE LAYER MAGNETICALLY CONNECTED WITH SHIELD," filed simultaneously on Oct. 8, 2010 with the present application.

TECHNICAL FIELD

The present invention relates to a thin film magnetic head and particularly a configuration of shields around a magneto resistance effect (MR) film.

BACKGROUND

As a reading element of a thin film magnetic head, a magneto resistance (MR) element made with a multilayer film is known. Conventionally, a current in plane (CIP) element, in which a sense current flows in a direction in plane with a film surface, has been primarily utilized. Recently, in order to enable further high density recording, a current perpendicular to the plane (CPP) element, in which a sense current flows in a direction orthogonal to a film surface, has been developed. As elements of this type, a tunnel magneto-resistance (TMR) element in which a TMR effect is utilized and a current perpendicular to the plane—giant magneto resistance (CPP-GMR) element in which a GMR effect is utilized have been known.

As an example of the GMR element or the TMR element, there is an element including a spin valve film (hereafter, referred to as SV film). The SV film includes a pinned layer of which a magnetization direction is pinned with respect to an external magnetic field, a free layer of which a magnetization direction varies corresponding to the external magnetic field, and a spacer sandwiched by the pinned layer and the free layer. The SV film is sandwiched by a pair of shields that are electrodes for supplying the sense current.

In a typical CPP element, hard magnetic layers are disposed via insulation films on both sides of the SV film in a track width direction. The hard magnetic layers are referred to as bias magnetic layers. The bias magnetic layers apply a bias magnetic field to the free layer such that the free layer is formed as a single domain layer. Such a single domain free layer has advantages that linearity of resistance variation is improved corresponding to an external magnetic field variation and that simultaneously Barkhausen noise is suppressed. Magnetization directions of the bias magnetic layers are pinned in the track width direction. In the present specification, the track width direction means a direction that is parallel to a track width direction of a recording medium when a slider including the MR element faces the recording medium.

However, in accompaniment with an improvement in a recording density of a recent magnetic recording medium, the thin film magnetic head has a so-called side reading problem in that magnetic information leaked from adjacent tracks is also read.

JP 2005-353666A discloses a thin film magnetic head in which soft magnetic layers are disposed on both sides of an MR element in a track width direction to cope with the side-reading problem. Since the soft magnetic material absorbs magnetic flux from adjacent tracks, the effect of noise due to the magnetic flux from the adjacent tracks is suppressed. As a result, a thin film magnetic head is provided that is compatible with a recording medium of high recording density.

However, these soft magnetic layers do not function to apply a bias magnetic field to the MR element. Accordingly, in JP 2005-353666A, the MR element is designed to include two free layers in each of which a magnetization direction varies corresponding to an external magnetic field and an antiferromagnetic coupling layer disposed between the free layers, and the antiferromagnetic coupling layer functions such that one free layer and the other free layer antiferromagnetically interact each other. As described above, the antiferromagnetic coupling layer provides a self bias function to both of the free layers. However, sufficient bias may not be applied to the free layers with such a bias function. Also, since a material of an antiferromagnetic coupling layer as a spacer is limited to a special one, it becomes difficult to improve the performance of the MR element.

As described above, it is difficult to apply sufficient bias to the free layers while maintaining the function of a side shield. Therefore, another configuration is desired in which sufficient bias is applied to the free layers maintaining the function of the side shield.

SUMMARY

According to one embodiment of the present invention, a thin film magnetic head includes: a magneto resistance effect film of which electrical resistance varies corresponding to an external magnetic field; a pair of shields provided on both sides in a manner of sandwiching the MR film in a direction that is orthogonal to a film surface of the MR film; an anisotropy providing layer that provides exchange anisotropy to a first shield of the pair of shields in order to magnetize the first shield in a desired direction, and that is disposed on the opposite side from the MR film with respect to the first shield; and side shields that are disposed on both sides of the MR film in a track width direction and that include soft magnetic layers magnetically connected with the first shield. The first shield means one of the pair of the shield, namely either an upper shield or a lower shield.

The anisotropy providing layer provides exchange anisotropy to the first shield, and magnetizes the first shield in a desired direction. Since the soft magnetic layers are magnetically connected with the first shield, the soft magnetic layers are also magnetized in the desired direction. The soft magnetic layers obtain a function to apply a bias magnetic field to an MR film by being magnetized in the desired direction.

Furthermore, since the soft magnetic layers are magnetically connected with the first shield, the magnetic field applied to the soft magnetic layers is absorbed by the first shield via the soft magnetic layers. As described above, the magnetic field applied to the MR film in a track width direction is efficiently absorbed by the side shields and the first shield. As a result, the function to shield the magnetic field on both sides of the MR film in the track width direction is maintained.

The above mentioned objects, features, and advantages of the present invention and other objects, features, and advantages will be disclosed by the following descriptions referring to the figures illustrating embodiments of the present invention.

DETAILED DESCRIPTION OF THE INVENTION

Figure 1:
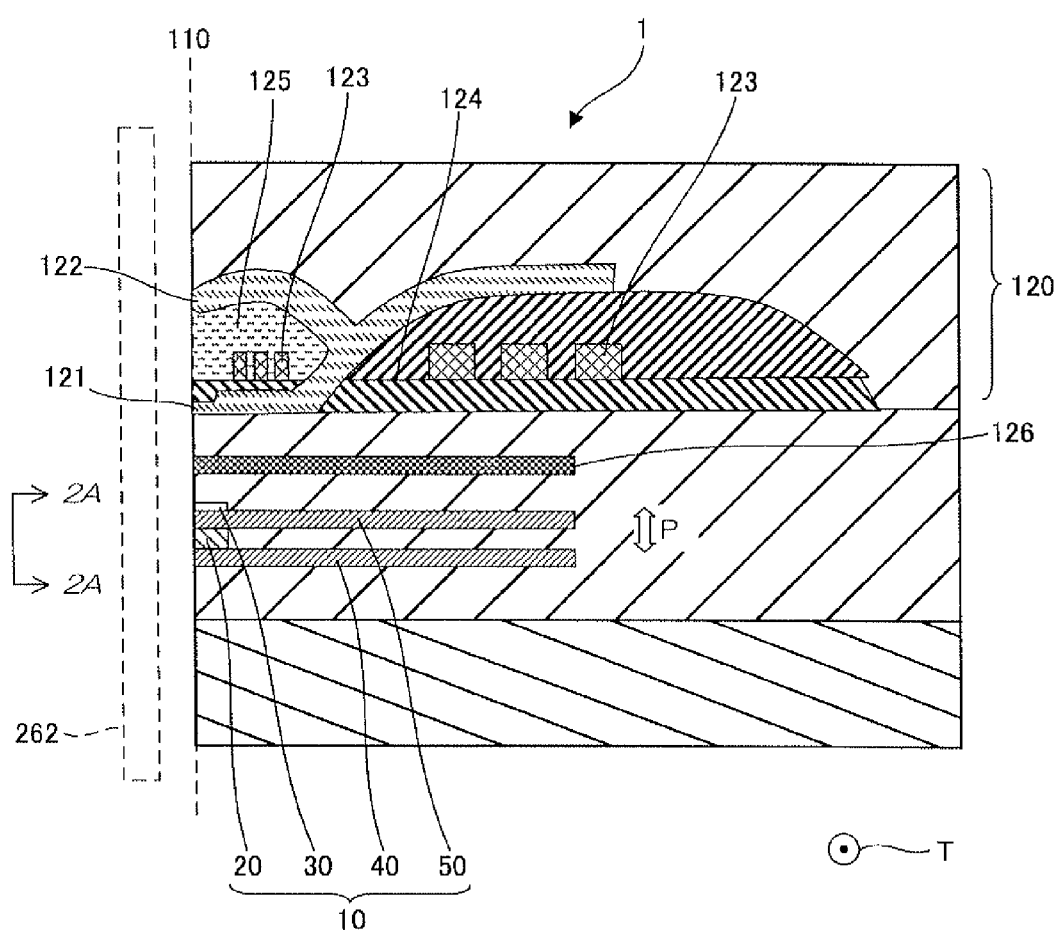
FIG. 1 is a schematic cross sectional view of a thin film magnetic head including a reading part and a writing part.

Hereafter, one embodiment of the present invention will be explained referring to the drawings.

FIG. 1 is a schematic cross sectional view of a thin film magnetic head of one embodiment of the present invention. This thin film magnetic head 1 is a composite head including a reading element 10 and a writing element 120. Alternatively, the thin film magnetic head may be a head exclusively for reading that includes only the reading element 10.

Figure 2:
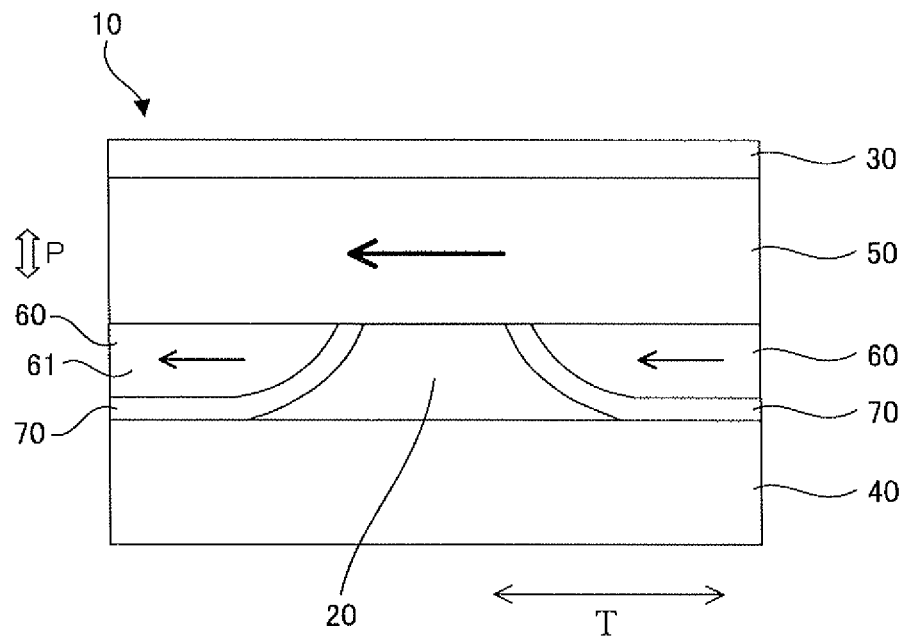
FIG. 2 is a schematic plan view of a reading part of a thin film magnetic head of a first embodiment, seen from an air bearing surface.

FIG. 2 is a schematic plan view of the reading element 10 of the thin film magnetic head 1 of the first embodiment, as seen from the 2A-2A direction in FIG. 1, or in other words, from an air bearing surface (ABS) 110. Herein, the ABS 110 is a surface of the thin film magnetic head 1 that faces a recording medium 262. A solid arrow in the figure indicates a magnetization direction of each layer.

The reading element 10 has a magneto resistance effect (MR) film 20 where electrical resistance varies corresponding to an external magnetic field. The MR film 20 is positioned in a manner of facing the recording medium 262.

In direction P that is orthogonal to a film surface of the MR film 20, a pair of shields that are a lower shield 40 and an upper shield 50 are provided on both sides in a manner of sandwiching the MR film 20. A magnetic layer of NiFe, CoFe, NiCoFe, or FeSiAl or the like, can be utilized for the lower shield 40 and the upper shield 50.

The lower shield 40 and the upper shield 50 also function as electrodes where a sense current flows in the direction P orthogonal to the film surface of the MR film 20 when voltage is applied to the MR film 20. A magnetic field of the recording medium 262 at a position facing the MR film 20 varies as the recording medium 262 moves. When the MR film 20 detects the magnetic field variation as electrical resistance variation, the thin film magnetic head 1 reads magnetic information written in each domain of the recording medium 262.

Side shields 60 are disposed on both sides of the MR film 20 in the track width direction T. The side shields 60 include soft magnetic layers 61 that are magnetically connected with an upper shield 50. In the present specification, "magnetically connected" indicates either a state where both magnetic layers contact each other, or a relationship where, when one magnetic layer is magnetized in a desired direction, the other magnetic layer is also magnetized in the desired direction due to magnetic interaction. Herein, one magnetization generated in one magnetic layer and the other magnetization generated in the other magnetic layer can be oriented either in the same direction or in opposite directions.

In the present embodiment, the side shields 60 are made only with soft magnetic layers 61 that are magnetically connected with the upper shield 50. The soft magnetic layers 61 contact the upper shield 50. The upper shield 50 can be made of either a material different from that of the side shields 60 or the same material. When the upper shield 50 is made of the same material as the side shields 60, the upper shield 50 and the side shields 60 can be configured in an integrated manner.

Insulation films 70 are disposed between the MR film 20 and side shields 60 and between the lower shield 40 and the side shields 60. The insulation films 70 prevent the sense current from flowing from the side shields 60 into the MR film 20 and prevent the sense current from flowing from the side shields 60 into the lower shield 40. The insulation films 70 can be formed of $Al_2O_3$, or the like.

An anisotropy providing layer 30 is disposed on the opposite side from the MR film 20 with respect to the upper shield 50. The anisotropy providing layer 30 provides exchange anisotropy to the upper shield 50 and magnetizes the upper shield 50 in a desired direction. For the anisotropy providing layer 30, an antiferromagnetic layer made of, such as IrMn, PtMn, RuRhMn, or FeMn, or a hard magnetic layer made of, such as CoPt, CoCrPt, or FePt, is utilized.

Since the soft magnetic layers 61 of the side shields 60 are magnetically connected with the upper shield 50, the soft magnetic layers 61 are magnetized in the desired direction. By being magnetized in the desired direction, the soft magnetic layers 61 obtain a function to apply a bias magnetic field to the MR film 20, especially to the free layer.

Also, since the soft magnetic layers 61 of the side shields 60 are magnetically connected with the upper shield 50, a magnetic field applied to the soft magnetic layers 61 is absorbed by the upper shield 50 via the soft magnetic layers 61. As described above, the magnetic field applied to both sides of the MR film 20 in the track width direction T is effectively absorbed by the side shields 60 and the upper shield 50. This maintains a function to shield the magnetic field applied to both sides of the MR film 20 in the track width direction T.

Also, since the magnetic field applied to both sides of the MR film 20 in the track width direction T is absorbed not only by the side shields 60 but also by the upper shield 50, magnetization direction variation of the side shields 60 is small. Therefore, the side shields 60 substantially apply the bias magnetic field to the free layer even under a condition where the external magnetic field has been applied.

Figure 3:
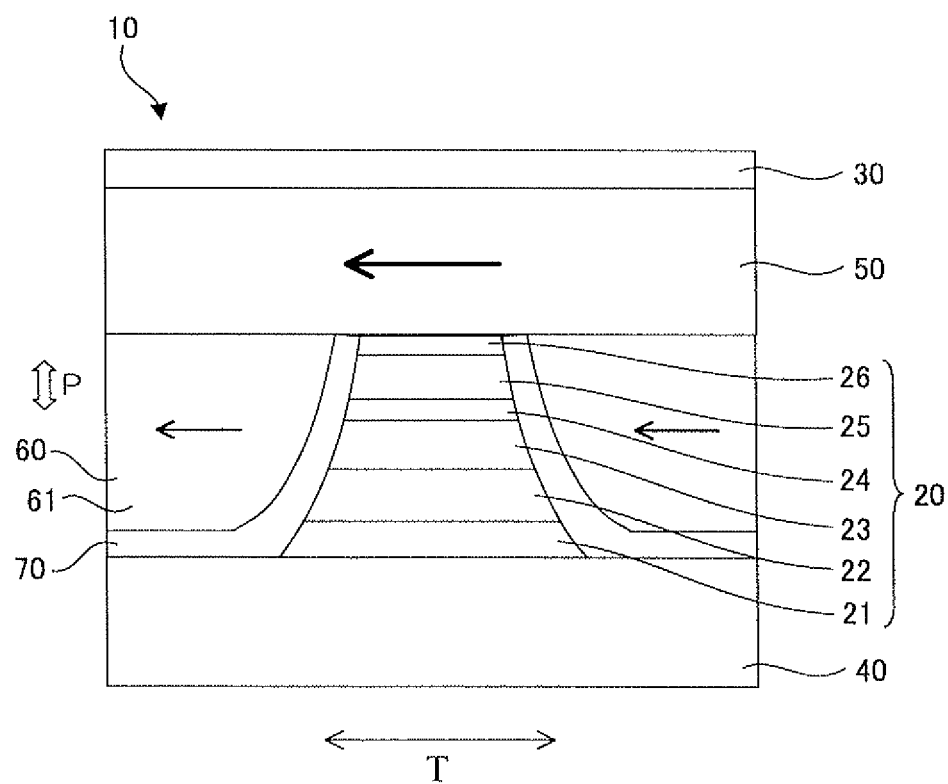
FIG. 3 is a plan view of one example of a lamination configuration of a magneto resistance effect (MR) film.

For the thin film magnetic head 1 of the present invention, an arbitrary MR film 20 including a free layer that is formed as a single domain layer due to the bias magnetic field is utilized. FIG. 3 illustrates one example of the configuration of the MR film. In FIG. 3, the MR film 20 is disposed on the lower shield 40 having an approximately 1 μm thickness. The MR film 20 is a SV film in which a buffer layer 21, a pinning layer 22, a pinned layer 23, a spacer 24, a free layer 25 and a cap layer 26 are laminated in this order.

The buffer layer 21 is disposed as a base of the pinning layer 22. A Ta layer, a NiCr layer, or a multilayer film of Ta and Ru, or the like is utilized for the buffer layer 21. The pinning layer 22 is disposed to pin a magnetization direction of the pinned layer 23. An antiferromagnetic layer made of IrMn, PtMn, RuRhMn, FeMn, or the like is utilized for the pinning layer 22.

The pinned layer 23 is a ferromagnetic layer where a magnetization direction is pinned with respect to the external magnetic field. A multilayer film in which, for example, CoF, Ru, or CoFe, or the like are laminated may be utilized for the pinned layer 23. The free layer 25 is a ferromagnetic layer of which the magnetization direction varies corresponding to the external magnetic field. For example, a multilayer film of CoFe and NiFe is utilized for the free layer 25. The side shields 60 apply the bias magnetic field to the free layer 25 such that the magnetization of the free layer 25 is oriented in a predefined direction without the external magnetic field.

The magnetization direction of the free layer 25 rotates corresponding to the external magnetic field, and forms an angle with respect to the magnetization direction of the pinned layer 23. In relation to the angle formed by the magnetization direction of the free layer 25 and the magnetization direction of the pinned layer 23, the electrical resistance of the MR film 20 varies. The thin film magnetic head 1 detects the electrical resistance variation and reads magnetic information of the recording medium.

The spacer 24 is disposed to maintain a distance between the free layer 25 and the pinned layer 23. Various materials, such as Cu, AlOx, or MgO, can be utilized for the spacer 24. The spacer is preferably a nonmagnetic layer; however, it is not limited to the nonmagnetic layer.

The cap layer 26 is disposed to prevent each of the laminated layers from deteriorating. A multilayer film of Ru and Ta, or the like is utilized for the cap layer 26. The upper shield 50 is formed above the cap layer 26.

The above-described thin film magnetic head 1 is manufactured by laminating sequentially each of the layers above the lower shield 40 by, for example, sputtering or the like, then by patterning the formed multilayer film by milling, or the like.

Figure 4:
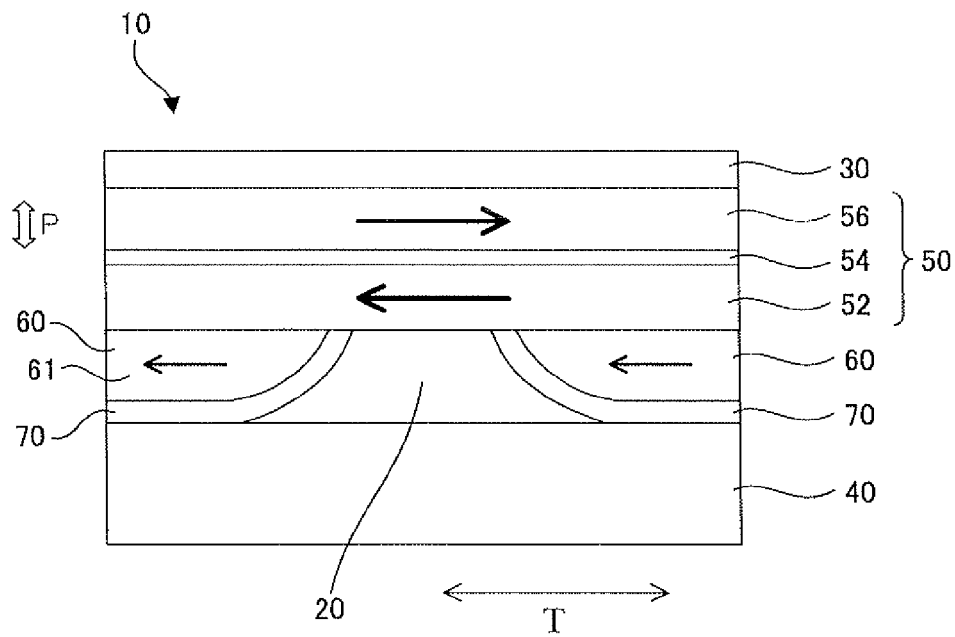
FIG. 4 is a schematic plan view of a reading part of a thin film magnetic head of a second embodiment, seen from an air bearing surface.

FIG. 4 is a schematic plan view of a reading element 10 of a thin film magnetic head 1 of a second embodiment, as seen from an air bearing surface. The arrows in the figure indicate a magnetization direction of each layer. In the second embodiment, the upper shield 50 that is magnetically connected with the soft magnetic layers 61 of the side shields 60 is configured with two soft magnetic layers 52 and 56 that are exchange-coupled via the magnetic coupling layer 54. The magnetic coupling layer 54 exchange-couples one soft magnetic layer 52 with the other soft magnetic layer 56. The magnetic coupling layer 54 is made with a nonmagnetic layer made of, for example, Ru, Rh, Cr, Cu, Ag or the like. The side shields 60 are magnetically connected with the first soft magnetic layer 52 that is a lower side of the upper shield 50. All other configurations are the same as the first embodiment. In addition, the upper shield 50 may include a plurality of the magnetic coupling layers 54, and also may include three or more of the soft magnetic layers.

In the second embodiment, the anisotropy providing layer 30 provides exchange anisotropy to the second soft magnetic layer 56 that is an upper side of the upper shield, and magnetizes the second soft magnetic layer 56 in the desired direction. Since the first soft magnetic layer 52 is antiferromagnetically or ferromagnetically exchange-coupled with the second soft magnetic layer 56, the first soft magnetic layer 52 is also magnetized in the desired direction. Since the side shields 60 including the soft magnetic layers 61 are magnetically connected with the soft magnetic layer 52 of the upper shield, the side shields 60 are also magnetized in the desired direction. As a result, the side shields 60 obtain a function to apply the bias magnetic field to the MR film 20.

Also, since the side shields 60 are magnetically connected with the upper shield 50, as in the first embodiment, the function is maintained of shielding the magnetic field applied to both sides of the MR film 20 in the track width direction T.

Figure 5:
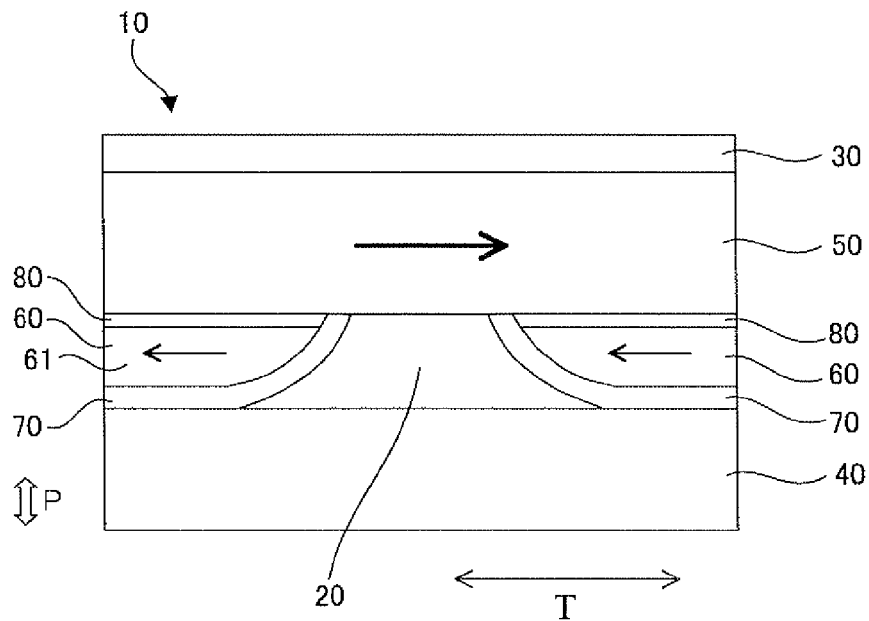
FIG. 5 is a schematic plan view of a reading part of a thin film magnetic head of a third embodiment, seen from an air bearing surface.

FIG. 5 is a schematic plan view of a reading element 10 of a thin film magnetic head 1 of the third embodiment, as seen from an air bearing surface. The arrows in the figure indicate a magnetization direction of each layer. In the third embodiment, side shields 60 including soft magnetic layers 61 are exchange-coupled with an upper shield 50 via a magnetic coupling layer 80. All other configurations are the same as the first embodiment. The magnetic coupling layer 80 is made with a nonmagnetic layer made of, for example, Ru, Rh, Cr, Cu, Ag or the like.

The anisotropy providing layer 30 provides exchange anisotropy to the upper shield 50 and magnetizes the upper shield 50 in the desired direction. Since the side shields 60 are antiferromagnetically or ferromagnetically exchange-coupled with the upper shield 50, the side shields 60 are also magnetized in the desired direction. As a result, the side shields 60 obtain a function to apply the bias magnetic field to the free layer of the MR film 20.

Since the side shields 60 is magnetically connected with the upper shield 50, as in the first embodiment, the function is maintained of shielding the magnetic field applied to both sides of the MR film 20 in the track width direction T.

Figure 6:
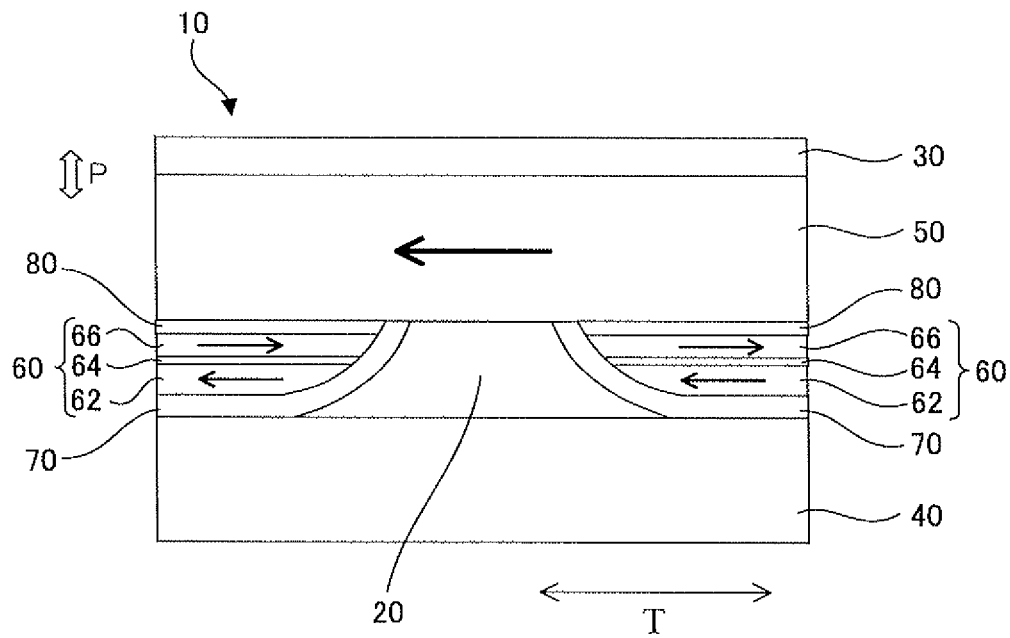
FIG. 6 is a schematic plan view of a reading part of a thin film magnetic head of a fourth embodiment, seen from an air bearing surface.

FIG. 6 is a schematic plan view of a reading element 10 of a thin film magnetic head 1 of a fourth embodiment, as seen from an air bearing surface. Each of the arrows in the figure indicates a magnetization direction of each layer. In the fourth embodiment, side shields 60 include a plurality of soft magnetic layers 62 and 66 that are exchange-coupled with each other via the magnetic coupling layer 64. The soft magnetic layers 66 that are an upper side of the side shields 60 are exchange-coupled with an upper shield 50 via a magnetic coupling layer 80. The magnetic coupling layers 64 and 80 are made with nonmagnetic layers such as, for example, Ru, Rh, Cr, Cu, Ag, or the like. All other configurations are the same as the third embodiment.

Also, in the present embodiment, since the side shields 60 are magnetized in the desired direction, the side shields 60 obtain the function to apply the bias magnetic field to the free layer of the MR film 20.

Also, since the side shields 60 are magnetically connected with the upper shield 50, as in the first embodiment, the function is maintained of shielding the magnetic field applied to both sides of the MR film 20 in the track width direction T.

Figure 7:
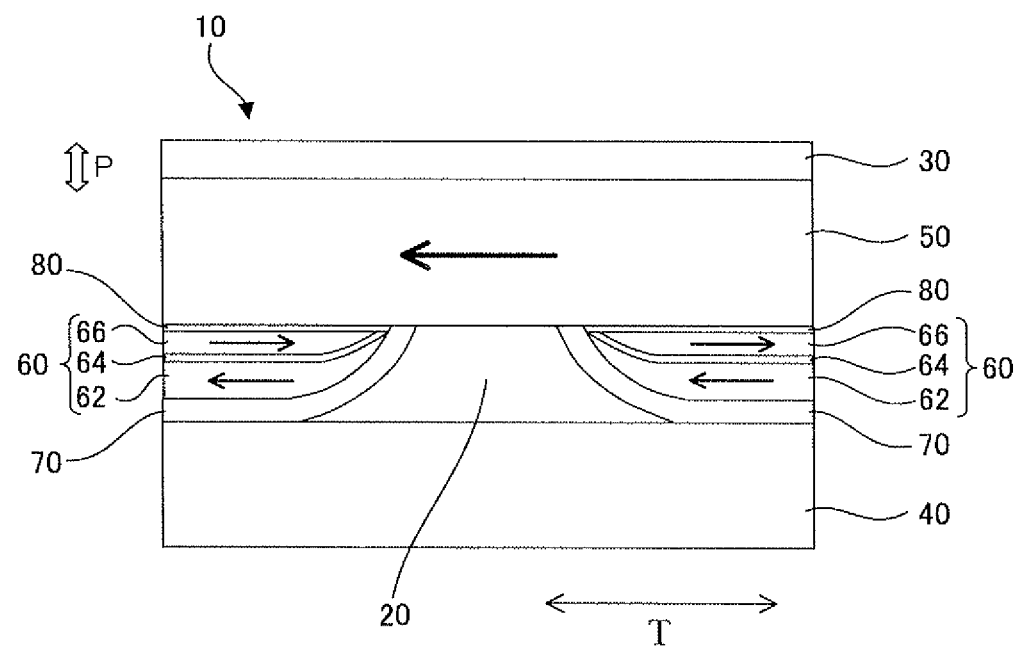
FIG. 7 is a schematic plan view of a reading part of a thin film magnetic head of a fifth embodiment, seen from an air bearing surface.

FIG. 7 is a schematic plan view of a reading element 10 of a thin film magnetic head 1 of a fifth embodiment, as seen from an air bearing surface. Each of the arrows in the figure indicates a magnetization direction of each layer. In the fifth embodiment, side shields 60 including soft magnetic layers include a plurality of soft magnetic layers 62 and 66 that are exchange-coupled with each other via magnetic coupling layers 64. The soft magnetic layers 62, which are at the bottom among the plurality of the soft magnetic layers 62 and 66 in the lamination direction P, protrude along surfaces of the side shields 60 that face the MR film 20. The soft magnetic layers 62, which are the bottom layers, preferably protrude up to the position of the free layer of the MR film 20. All other configurations are the same as the fourth embodiment.

In the present embodiment, since the soft magnetic layers 62, which are the bottom layers of the side shields 60, protrude, the soft magnetic layers 62 primarily apply the bias magnetic field to the MR film 20. Therefore, even if the pluralities of the soft magnetic layers 62 and 66 that configure the side shields 60 are magnetized in different directions, it is possible to efficiently apply the bias magnetic field to the MR film 20.

In order to more efficiently apply the bias magnetic field to the MR film 20, the soft magnetic layers 62, which are the bottom layers, preferably have film thicknesses larger than the other soft magnetic layers 66.

Also, since the side shields 60 are magnetically connected with the upper shield 50, as in the first embodiments, the function is maintained of shielding the magnetic field applied to both sides of the MR film 20 in the track width direction T.

Such side shields 60 are easily manufactured by laminating the MR film 20 above the lower shield 40 first, then by forming the insulation films 70 and the side shields 60 by sputtering or the like. This is because, as illustrated in FIG. 7, at least a slope is formed when the side shields 60 are formed by vapor-deposition to uneven portions by sputtering or the like.

It is also possible to utilize a thin film magnetic head 1 including a reading element 10 in which some of the plurality of the above-described embodiment are combined. For example, FIG. 8 illustrates a reading element 10 of a thin film magnetic head in which the second embodiment and the fifth embodiment are combined.

Figure 8:
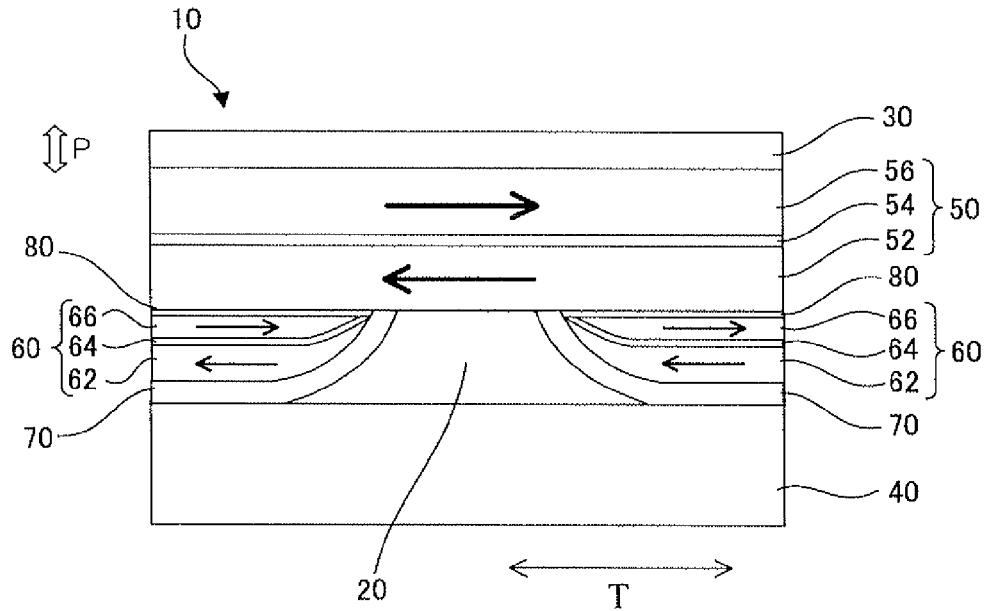
FIG. 8 is a schematic plan view of a reading part of a thin film magnetic head of a sixth embodiment, seen from an air bearing surface.

In the thin film magnetic head of the sixth embodiment illustrated in FIG. 8, side shields 60 include a plurality of soft magnetic layers 62 and 66 that are exchange-coupled with each other via a magnetic coupling layer 64. Furthermore, the upper shield 50 is made with two soft magnetic layers 52 and 56 that are exchange-coupled via a magnetic coupling layer 54. The soft magnetic layers 66 that are top layers of the side shields 60 are exchange-coupled with the soft magnetic layer 52 that is a bottom layer of the upper shield via a magnetic coupling layer 80.

In the above-described embodiment, the soft magnetic layers included in the side shields 60 are magnetically connected with the upper shield 50. However, the soft magnetic layers included in the side shields 60 may be magnetically connected with a lower shield 40. One example of such a reading element 10 is illustrated in FIG. 9.

Figure 9:
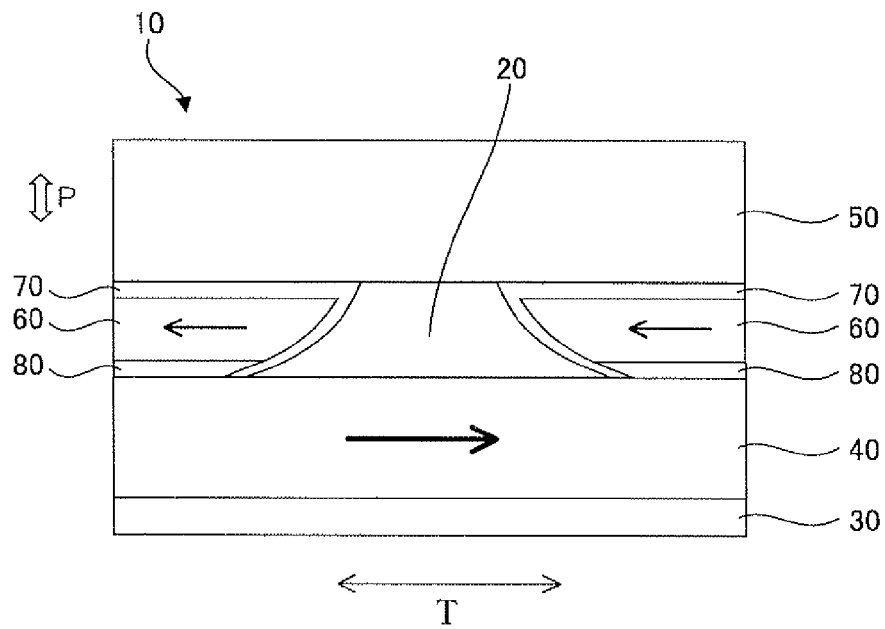
FIG. 9 is a schematic plan view of a reading part of a thin film magnetic head of a seventh embodiment, seen from an air bearing surface.

FIG. 9 illustrates a recording element 10 of a thin film magnetic head of a seventh embodiment. In FIG. 9, side shields 60 made with soft magnetic layers are magnetically connected with lower shield 40 via a magnetic coupling layer 80. Additionally, the side shields 60 may contact the lower shield 40, and may include a plurality of soft magnetic layers. Also, the lower shield 40 may include a plurality of soft magnetic layers that are exchange-coupled with each other via magnetic coupling layer.

Insulation layers 70 are disposed between a MR film 20 and the side shields 60, and between the upper shield 50 and the side shields 60.

An anisotropy providing layer 30 is disposed on the opposite side from the MR film 20 with respect to the lower shield 40. The anisotropy providing layer 30 provides exchange anisotropy to the lower shield 40 and magnetizes the lower shield 40 in a desired direction. For the anisotropy providing layer 30, an antiferromagnetic layer made of, such as IrMn, PtMn, RuRhMn, or FeMn, or a hard magnetic layer made of, such as CoPt, CoCrPt, or FePt, is utilized.

Since the soft magnetic layers of the side shields 60 are magnetically connected with the lower shield 40, the soft magnetic layers are also magnetized in a desired direction. Therefore, the side shields 60 obtain the function to apply the bias magnetic field to a free layer of the MR film 20. Also, since the side shields 60 are magnetically connected with the lower shield 40, the magnetic field applied to both sides of the MR film 20 in the track width direction T is efficiently absorbed by the side shields 60 and the lower shield 40. As a result, the function is maintained of shielding the magnetic field applied to both sides of the MR film in the track width direction T.

Next, referring to FIG. 1, a configuration of a writing element 120 will be explained in detail. The writing element 120 is formed above the reading element 10 via an inter-element shield 126 formed by sputtering or the like. The writing element 120 has a configuration for so-called perpendicular magnetic recording. A magnetic pole layer for writing is configured with a main pole layer 121 and an auxiliary pole layer 122. These magnetic pole layers 121 and 122 are formed by a frame plating method or the like. The main pole layer 121 is made of FeCo, and is exposed in a direction substantially orthogonal to the ABS 110 on the ABS 110. In the surrounding area of the main pole layer 121, coil layers 123 extended over a gap layer 124 made of an insulation material are wound, and magnetic flux is induced to the main pole layer 121 by the coil layers 123 or the like. The coil layers 123 are made by a frame plating method. The magnetic flux is induced to an inside of the main pole layer 121 and is extended toward the recording medium 262 from the ABS 110. The main pole layer 121 is tapered not only in the film surface orthogonal direction P but also in the track width direction T (a sheet surface orthogonal direction of FIG. 1) in the vicinity of the ABS 110, and generates a minute and strong writing magnetic field that corresponds to high recording density.

The auxiliary pole layer 122 is a magnetic layer that magnetically couples to the main pole layer 121. The auxiliary pole layer 122 is a magnetic pole layer that is made of an alloy of any two or three of Ni, Fe or Co, and that has a film thickness of approximately 0.01 μm—approximately 0.5 μm. The auxiliary pole layer 122 is branched from the main pole layer 121 and faces the main pole layer 121 via the gap layer 124 and a coil insulation layer 125 on the ABS 110 side. An edge part of the auxiliary pole layer 122 on the ABS 110 side forms a trailing shield part whose layer cross section is wider than the other parts of the auxiliary pole layer 122. The placement of such an auxiliary pole layer 122 causes an even steeper gradient in the magnetic field between the auxiliary pole layer 122 and the main layer 121 in the vicinity of the ABS 110. As a result, signal output jitter becomes small and an error rate during a reading process becomes small.

Figure 10:
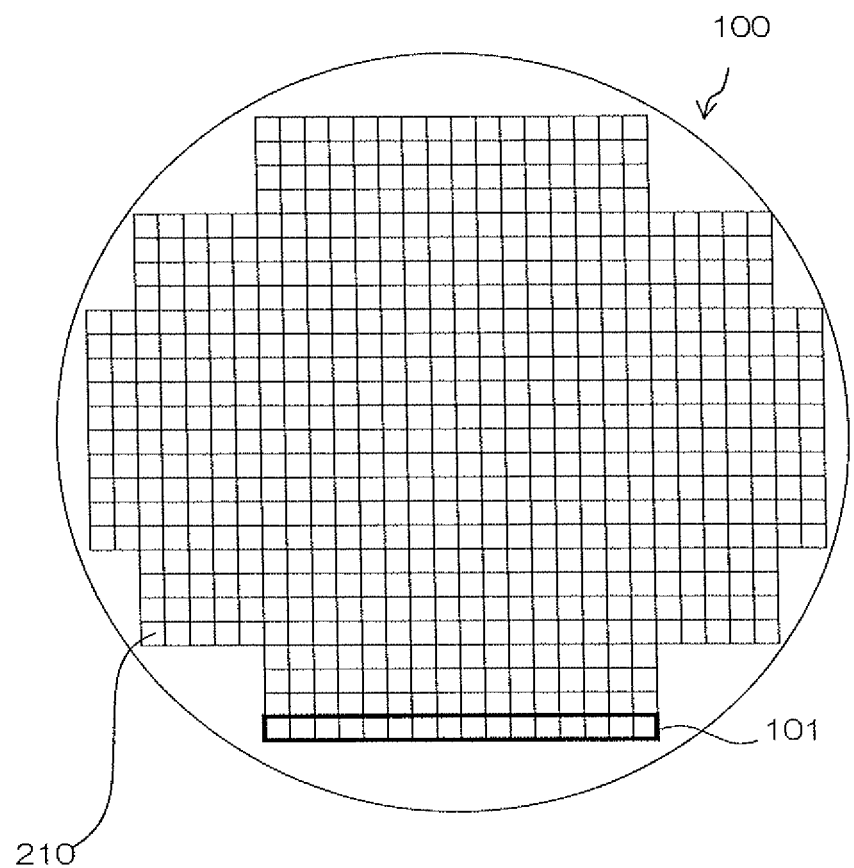
FIG. 10 is a plan view of a wafer in relation to the manufacture of the thin film magnetic head of the present invention.

Next, a wafer to be utilized for manufacturing the above-described thin film magnetic head will be explained. Referring to FIG. 10, at least a lamination film forming the above-described thin film magnetic heads is formed on a wafer 100. The wafer 100 is divided into a plurality of bars 101, which are working units for the polishing process of the ABS. The bar 101 is further cut after the polishing process and is divided into sliders 210 including the thin film magnetic head. Margins for cutting (not illustrated) that are for cutting the wafer 100 into the bar 101 and for cutting the bar 101 into the slider 210 are formed in the wafer 100.

Figure 11:
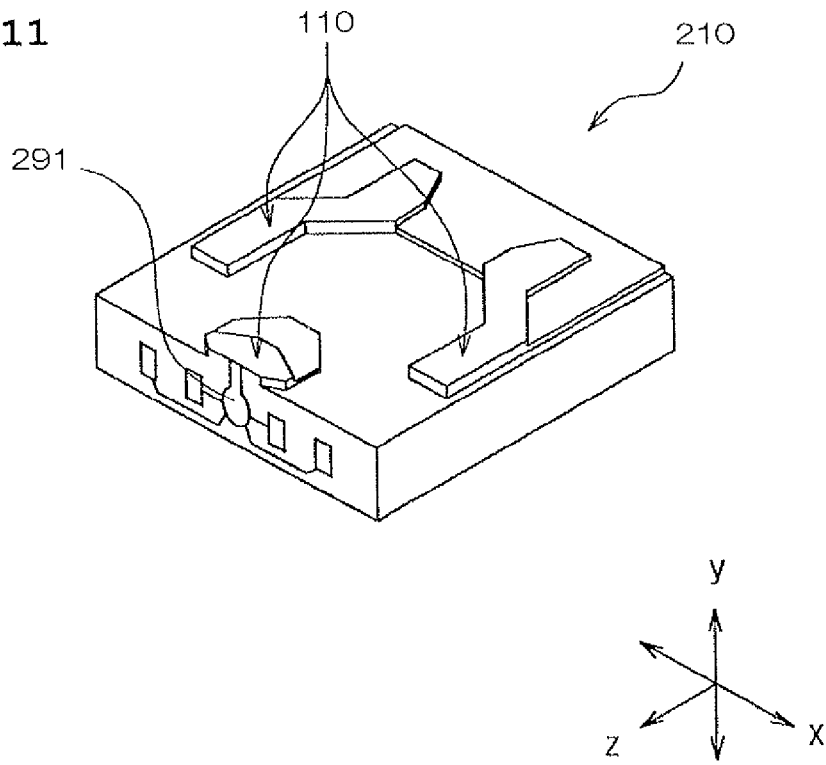
FIG. 11 is a perspective view of a slider of the present invention.

Referring to FIG. 11, the slider 210 has a substantially hexahedral shape, and one surface of the six outer surfaces is the ABS 110 facing a hard disk.

Figure 12:
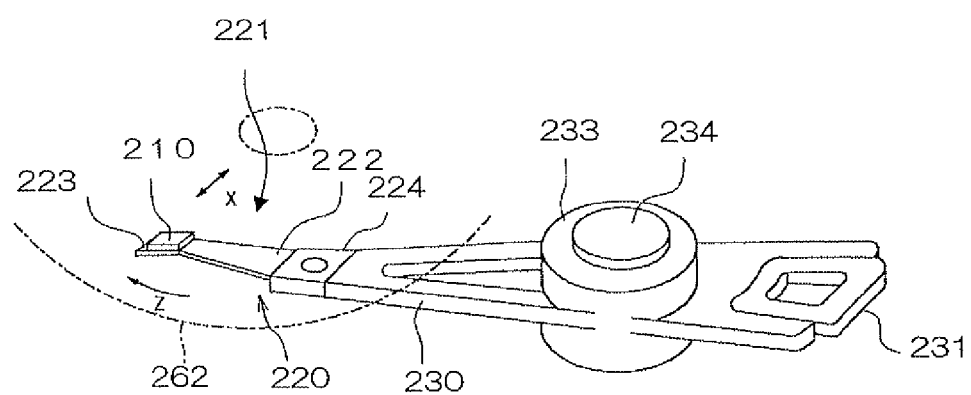
FIG. 12 is a perspective view of a head arm assembly including a head gimbal assembly in which the slider of the present invention is incorporated.

Referring to FIG. 12, a head gimbal assembly 220 includes the slider 210 and a suspension 221 elastically supporting the slider 210. The suspension 221 has a load beam 222, a flexure 223, and a base plate 224. The load beam 222 is formed in a plate spring shape and made of stainless steel. The flexure 223 is arranged in one edge part of the load beam 222. The base plate 224 is arranged in the other edge part of the load beam 222. The flexure 223 is joined to the slider 210 to give the slider 210 suitable flexibility. At the part of the flexure 223 to which the slider 210 is attached, a gimbal part is disposed to maintain the slider 210 in an appropriate orientation.

The slider 210 is arranged in the hard disk device such that the slider 210 faces the hard disk, which is a disk-shaped recording medium that is rotatably driven. When the hard disk rotates in the z-direction of FIG. 12, air flow passing between the hard disk and the slider 210 generates a downward lifting force in the y-direction to the slider 210. The slider 210 flies from the surface of the hard disk due to the lifting force. In the vicinity of the edge part of the slider 210 (edge part in bottom left of FIG. 11) at the air flow exit side, the thin film magnetic head 291 is formed.

A part in which the head gimbal assembly 220 is mounted on an arm 230 is referred to as a head arm assembly 221. The arm 230 moves the slider 210 in the track crossing direction x of the hard disk 262. One edge of the arm 230 is mounted on the base plate 224. On the other edge of the arm 230, a coil 231 is mounted, which forms one part of a voice coil motor. A bearing part 233 is arranged in the middle section of the arm 230. The arm 230 is rotatably supported by a shaft 234 mounted on the bearing part 233. The arm 230 and the voice coil motor for driving the arm 230 configure an actuator.

Figure 13:
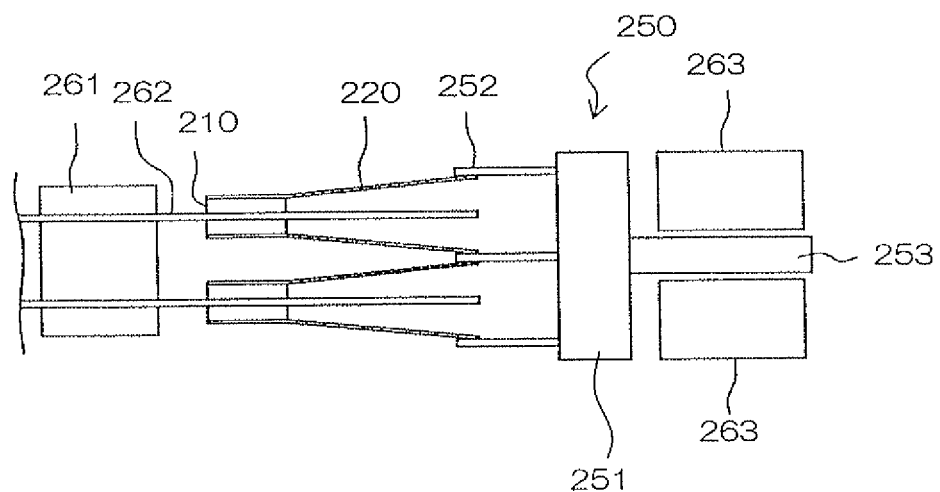
FIG. 13 is a side view of a head arm assembly in which the slider of the present invention is incorporated.
Figure 14:
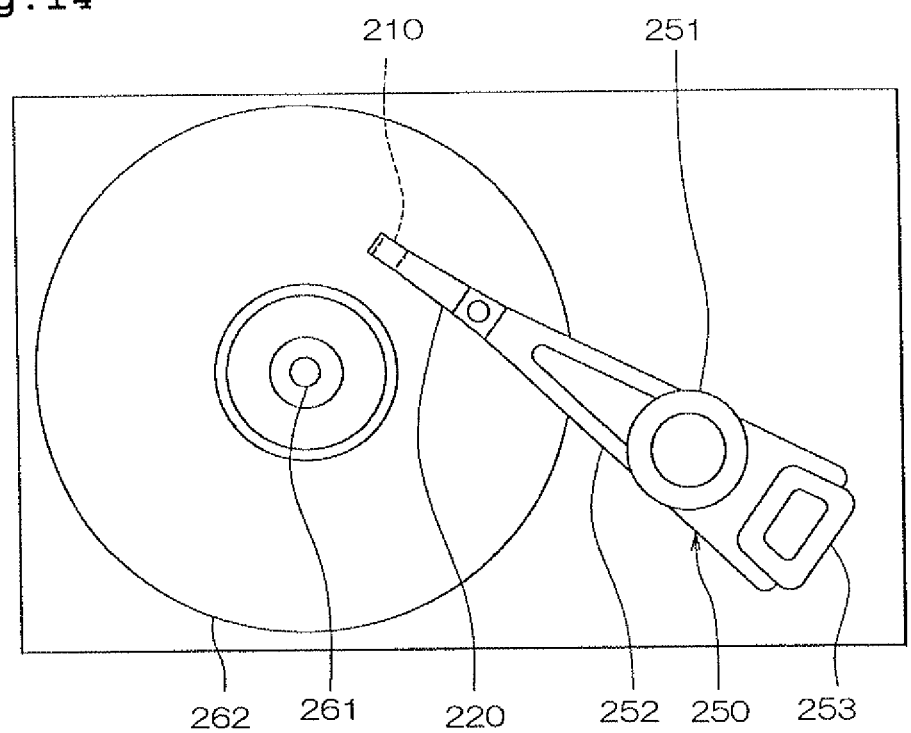
FIG. 14 is a plan view of a hard disk device in which the slider of the present invention is incorporated.

Next, referring to FIGS. 13 and 14, a head stack assembly in which the above-described slider is integrated and the hard disk device will be explained. The term "head stack assembly" refers to a component in which the head gimbal assemblies 220 are respectively mounted on a plurality of the arms provided with a carriage. FIG. 13 is a side view of the head stack assembly. FIG. 14 is a plan view of the hard disk device. The head stack assembly 250 includes a carriage 251 having a plurality of arms 230. On each of the arms 252, the head gimbal assembly 220 is mounted so that the head gimbal assemblies 220 align with an interval in the vertical direction. At the opposite side of the arm 252 from the carriage 251, the coil 253 is mounted to be a part of the voice coil motor. The voice coil motor has permanent magnets 263 arranged sandwiching the coil 231 and facing each other.

Referring to FIG. 14, the head stack assembly 250 is integrated in the hard disk device. The hard disk device has multiple hard disks 262 mounted on a spindle motor 261. On each of the hard disks 262, two sliders 210 are arranged in a manner of sandwiching the hard disk 262 and facing each other. The head stack assembly 250 except for the slider 210 and an actuator, corresponding to a positioning device of the present invention, not only support the slider 210 but also position the slider 210 with respect to the hard disk 262. The slider 210 is moved in the track crossing direction of the hard disk 262 by the actuator, and is positioned with respect to the hard disk 262. The thin film magnetic head 1 included in the slider 210 records the information to the hard disk 262 by the recording head, and reproduces the information recorded on the hard disk 262 by the reproducing head.

A description of the preferred embodiment according to the present invention was given above in detail. However, it should be appreciated that a wide variety of alterations and modifications are possible as far as they do not depart from the spirit and scope of the attached claims.

What is claimed is:

1. A thin film magnetic head, comprising:
    a magneto resistance effect film (MR film) of which electrical resistance varies corresponding to an external magnetic field;
    a pair of shields provided on both sides in a manner of sandwiching the MR film in a direction that is orthogonal to a film surface of the MR film;
    an anisotropy providing layer that provides exchange anisotropy to a first shield of the pair of shields in order to magnetize the first shield in a desired direction, and that is disposed on the opposite side from the MR film with respect to the first shield; and
    side shields that are disposed on both sides of the MR film in a track width direction and that include soft magnetic layers magnetized by magnetic connection with the first shield, wherein
    the MR film includes a free layer of which a magnetization direction varies corresponding to the external magnetic field, and
    magnetizations of the soft magnetic layers generate a bias magnetic field which orients a magnetization of the free layer toward a predetermined direction without the external magnetic field.

2. The thin film magnetic head according to claim 1, wherein
    the pair of shields are electrodes that apply voltage to the MR film so that a sense current flows in the direction that is orthogonal to the film surface of the MR film.

3. The thin film magnetic head according to claim 1, wherein
    the anisotropy providing layer is an antiferromagnetic layer.

4. The thin film magnetic head according to claim 1, wherein
    the anisotropy providing layer is a hard magnetic layer.

5. The thin film magnetic head according to claim 1, wherein
    the soft magnetic layer is exchange-coupled with the first shield via a magnetic coupling layer that is nonmagnetic.

6. The thin film magnetic head according to claim 1, wherein
    the side shield includes a plurality of the soft magnetic layers that are exchange-coupled with each other via a magnetic coupling layer that is nonmagnetic.

7. The thin film magnetic head according to claim 6, wherein
    the soft magnetic layer, which is the bottom among the plurality of the soft magnetic layers in a lamination direction, protrudes along a surface of the side shield that faces the MR film.

8. The thin film magnetic head according to claim 7, wherein
    the soft magnetic layer, which is the bottom among the plurality of the soft magnetic layers in the lamination direction, has a film thickness larger than the other soft magnetic layers.

9. The thin film magnetic head according to claim 1, wherein
    the side shield is made only with the soft magnetic layer that is magnetically connected with the first shield, contacting the first shield.

10. The thin film magnetic head according to claim 9, wherein the side shield is made only with the soft magnetic layer that is magnetically connected with the first shield, and the first shield is made of the same material as the soft magnetic layer and is formed in an integrated manner with the side shield.

11. The thin film magnetic head according to claim 1, wherein
the first shield includes a plurality of soft magnetic layers that are exchange-coupled via a magnetic coupling layer that is nonmagnetic.

12. The thin film magnetic head according to claim 1, wherein
the MR film is a spin valve film that includes a pinned layer of which a magnetization direction is pinned with respect to the external magnetic field, the free layer, and a spacer that is disposed between the pinned layer and the free layer.

13. A slider that includes the thin film magnetic head according to claim 1.

14. A head gimbal assembly that includes the slider according to claim 13 and a suspension that elastically supports the slider.

15. A hard disk device that includes the slider according to claim 13 and a positioning device that supports the slider and that positions the slider with respect to a recording medium.

16. A wafer in which a lamination film including the thin film magnetic head according to claim 1 is formed.

* * * * *